United States Patent
Ikeda et al.

(10) Patent No.: US 6,291,309 B1
(45) Date of Patent: Sep. 18, 2001

(54) SEMICONDUCTOR DEVICE AND METHOD FOR MANUFACTURING THE SAME

(75) Inventors: Kouichi Ikeda, Niigata; Takeshi Ikeda, Tokyo, both of (JP)

(73) Assignee: Niigata Seimitsu Co., Ltd. (JP)

(*) Notice: Subject to any disclaimer, the term of this patent is extended or adjusted under 35 U.S.C. 154(b) by 0 days.

(21) Appl. No.: 09/554,632

(22) PCT Filed: Feb. 27, 1998

(86) PCT No.: PCT/JP98/00812

§ 371 Date: May 16, 2000

§ 102(e) Date: May 16, 2000

(87) PCT Pub. No.: WO99/28970

PCT Pub. Date: Jun. 10, 1999

(30) Foreign Application Priority Data

Nov. 28, 1997 (JP) .................................................. 9-344152

(51) Int. Cl.[7] .................................................. H01L 21/66
(52) U.S. Cl. .......................... 438/417; 438/418; 523/204; 257/787
(58) Field of Search ................................ 438/14, 106, 16; 225/1; 257/237

(56) References Cited

U.S. PATENT DOCUMENTS

| | | | | |
|---|---|---|---|---|
| 5,864,178 | * | 1/1999 | Yamada et al. ........................ | 257/737 |
| 5,970,319 | * | 11/1999 | Banks .................................... | 438/115 |
| 6,150,194 | * | 11/2000 | Sakaguchi ............................. | 438/118 |
| 6,191,493 | * | 2/2001 | Yasunaga .............................. | 257/787 |
| 6,211,462 | * | 4/2001 | Carter ..................................... | 257/676 |
| 6,244,277 | * | 4/2001 | Kawata ................................. | 524/493 |
| 6,248,281 | * | 4/2001 | Watanabe .............................. | 438/612 |

FOREIGN PATENT DOCUMENTS 6-61417  3/1994 (JP) .

* cited by examiner

*Primary Examiner*—John F. Niebling
*Assistant Examiner*—Andre' C. Stevenson
(74) *Attorney, Agent, or Firm*—Dellett and Walters

(57) ABSTRACT

A semiconductor device which is mounted with a plurality of semiconductor chips. The fraction defective is low when the device is manufactured, and the efficiency of inspection is high. A method for manufacturing such a semiconductor device is also disclosed. A plurality of kinds of semiconductor chips 1 are COB-mounted on a substrate 2 and the surface of the substrate 2 mounted with the chips 1 is encapsulated with a resin 3. Then all the chips 1 mounted on the substrate 2 are inspected at once. Semiconductor devices 10 are produced by cutting the substrate 2 into pairs of adjacently arranged two different kinds of semiconductor chips 1 together which are judged to be nondefective chips.

3 Claims, 6 Drawing Sheets

SEMICONDUCTOR DEVICE AND METHOD FOR MANUFACTURING THE SAME

TECHNICAL FIELD

The present invention relates to a semiconductor device that is implementable on a mother board or the like, and a method for manufacturing the same.

BACKGROUND ART

A conventional semiconductor device is assembled in a packaged condition. In addition, there is a case where a multichip module is configured by implementing a plurality of semiconductor chips on the substrate; however, causes increase in a defect rate in overall the module by accumulating the defect rate of respective semiconductor chips. For example, in the case where two semiconductor chips are implemented on a single module substrate, one defect memory chip causes overall defect of the module. Therefore, it is necessary handling to replace the defect semiconductor chip as a repairing work and discard the overall module as a defect product. Thus, a low yield and a low efficiency occur.

Quality inspection is simultaneously carried out in every unit of one or a plurality of the packed semiconductor chip and the semiconductor chip implemented on the module substrate. However, in the case where the total number of semiconductor chips to inspect is too many, a small number of semiconductor chips handlable by a single inspection decreases inspecting efficiency. Therefore, a method is desired to increase the inspection efficiency.

DISCLOSURE OF THE INVENTION

The present invention has been created in consideration of such point and has an object is to provide a semiconductor device and a method for manufacturing the same that can reduce defect rate in manufacturing the semiconductor device on which a plurality of semiconductor chips is implemented and can improve efficiency of inspection of respective semiconductor chips.

According to the present invention, the semiconductor device is formed by dividing semiconductor chips in a unit of a plurality according to the result of quality inspection of respective semiconductor chips after implementation of a plurality of other kind of semiconductor chips on the substrate to seal in a resin. Dividing semiconductor chips is carried out according to the result of quality inspection. When the semiconductor substrate comprising a plurality of semiconductor chips is manufactured, a defective part of semiconductor chips does not cause defect of overall semiconductor device. Thus, the defect rate in manufacturing the semiconductor device can be reduced. The semiconductor chip inspected for every substrate unit allows increase in inspection efficiency in comparison with inspection for individual a few semiconductor chips.

Particularly, it is preferable that a plurality of semiconductor chips is implemented on one surface of the substrate and respective semiconductor chips are inspected through a terminal formed on the other surface. In this case, the overall one substrate can be handled as one part to inspect a plurality of semiconductor chips implemented on the substrate. Thus, time for inspection can be reduced in comparison with the case where the inspection is carried out in a unit of the memory modules on which memories individually packed and a plurality of memory chips are implemented.

BEST MODE FOR CARRYING OUT THE INVENTION

Figure 1A:
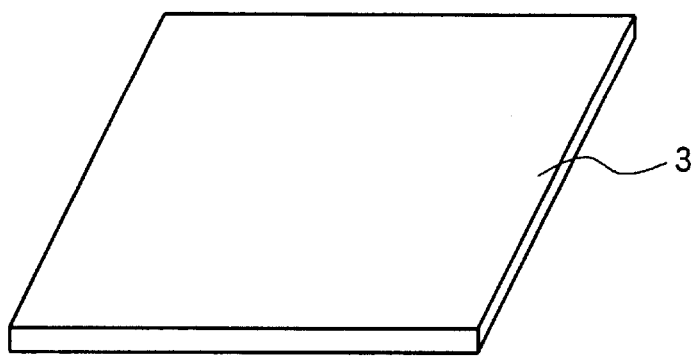
FIGS. 1(a) through 1(d) are figures showing a manufacturing process for a semiconductor device of embodiments of the present invention.

The semiconductor device of an embodiment according to the present invention is specifically described below with reference to the drawings. FIG. 1 is a figure showing a manufacturing step for a semiconductor device of embodiments of the present invention. As shown in the FIG. 1(d) the memory module 10 as the semiconductor device is configured by including the semiconductor chip 1 (processor bare chip 1a and memory bare chip 1b) divided from a semiconductor wafer, the substrate 2 on which the semiconductor chip 1 is implemented, and the resin 3 to seal a surface on which the semiconductor chip 1 of the substrate 2 is implemented.

Figure 1B:
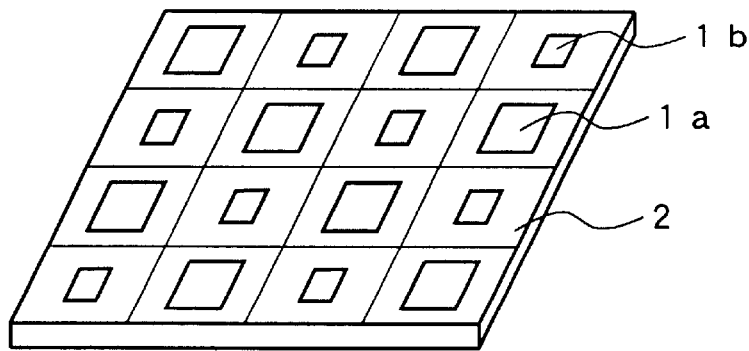
Figure 1C:
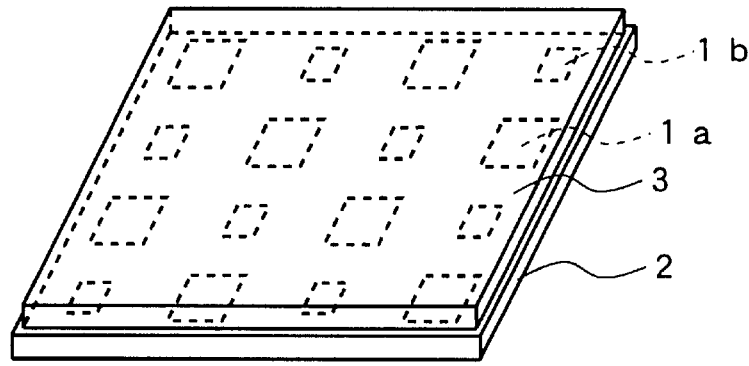

As shown in the FIGS. 1(a) and 1(b), the substrate is first introduced and on this substrate 2, a plurality of semiconductor chips 1 are implemented by arranging on the one surface with a given longitudinal and transverse distance (the first step). Arrangement is carried out to abut the processor bare chip 1a against the memory bare chip 1b each other in all four directions with a given distance. As the implementing method of respective semiconductor chips 1, for example, COB (Chip On Board) implementation is applied.

Figure 2A:
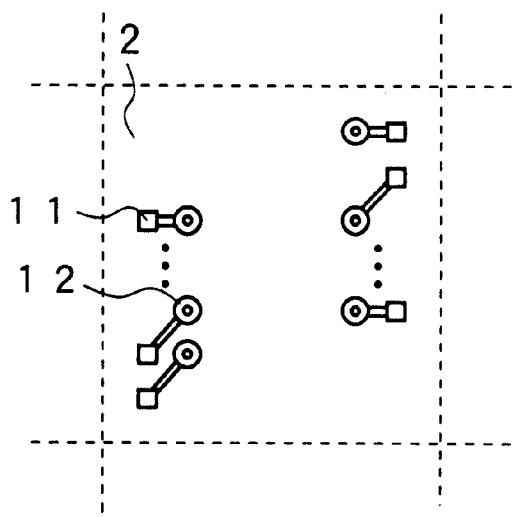
FIGS. 2(a) through 2(c) are figures showing a partial structure of a substrate before implementation of a semiconductor chip.
Figure 2B:
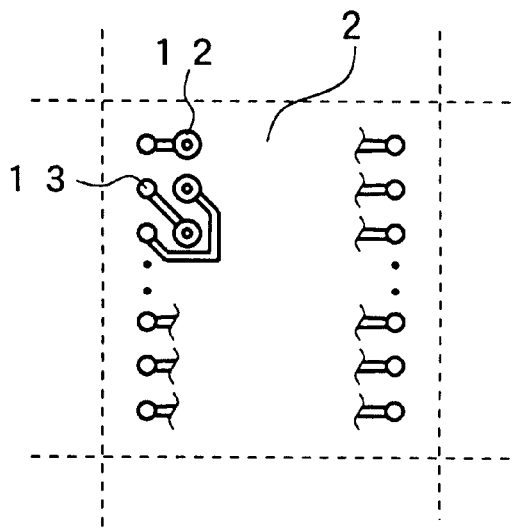
Figure 2C:
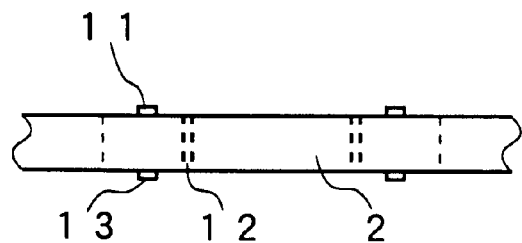

FIG. 2 is a figure showing a partial structure of a substrate 2 before implementation of the semiconductor chip 1. The FIG. 2(a), the FIG. 2(b), and the FIG. 2(c) represent a surface of the side on which the semiconductor chip 1 is implemented, the surface of the opposite side (reverse surface), and the structure in side view, respectively. As shown in these figures, on the substrate 2, a substrate pad 11 necessary for an electric connection to the semiconductor chip 1 is formed for the given every regions on which the semiconductor chip 1 is implemented. This substrate pad 11 is electrically connected to a BGA (Ball Grid Array) pad 13 on the reverse side via a through hole 12.

Figure 3A:
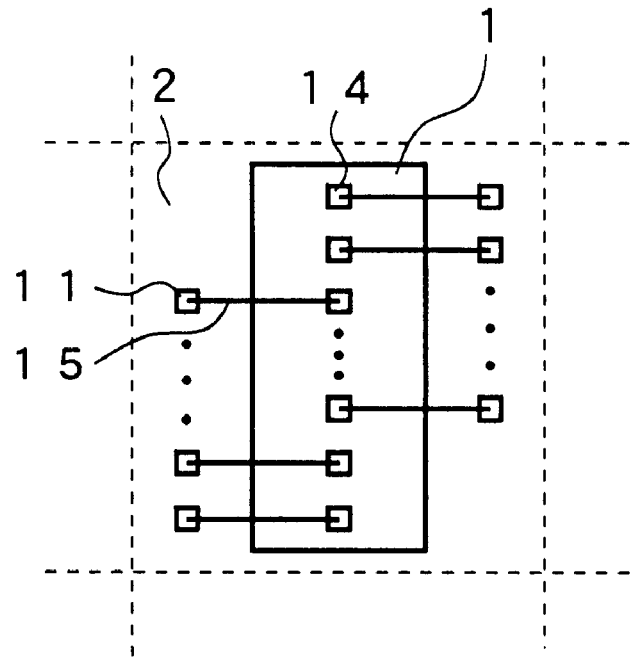
FIGS. 3(a) and 3(b) are figures showing a condition in which the semiconductor chip is implemented on the substrate shown in the FIGS. 2(a) through 2(c).
Figure 3B:
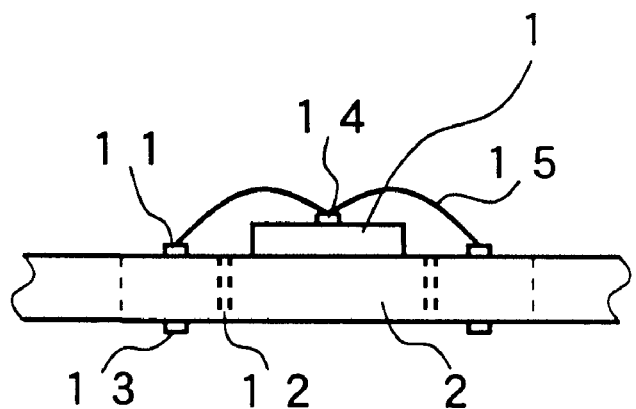

FIG. 3 is a figure showing a condition in which the semiconductor chip 1 is implemented on the substrate 2, shown in the FIG. 2, in the first step. The FIGS. 3(a) and 3(b) show the implementing surface of semiconductor chip 1 and the structure in side view, respectively. On the surface of respective semiconductor chip 1, lines of chip pads 14 arranged according to the types are formed (for example in FIG. 3, a line along with the longer side of the semiconductor chip 1). The chip pads 14 are connected to a substrate pad 11 formed on the substrate 2 by using a bonding wire 15. The COB implementation is carried out for respective memory bare chip 1 by using such bonding wire 15.

After implementation of the semiconductor chips 1 on the substrate 2 in the first step as described above, as shown in the FIG. 1(c), the resin 3 is poured into the surface on which the semiconductor chips 1 of the substrate 2 has been implemented to seal respective semiconductor chips 1 with the resin 3 of a given thickness (the second step).

The second step is to realize prevention of break and short of the bonding wire 15 connected to semiconductor chips 1 by sealing respective semiconductor chips 1 with the resin 3. In addition, the given thickness of the resin 3 reduces irregularity of heights of the semiconductor device 10 manufactured.

Subsequently, in the condition in which sealing has been carried out with the resin 3 by such way, respective semiconductor chips 1 are inspected for quality (the third step). For example, various function tests are carried out by pressing an inspection probe to the BGA pad 13 that is formed on the reverse surface of the substrate 2, to contact electrically. Inspection efficiency is increased by inspecting semiconductor chips 1 in the unit of overall substrate 2; in other words, by a single inspection for a plurality of semiconductor chips 1, that is implemented on the substrate 2.

Figure 1D:
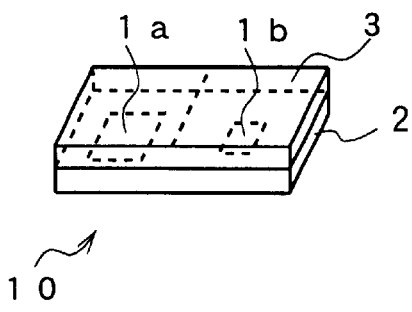

Next, on the basis of the result of inspection in the third step, as shown in the FIG. 1(d), the semiconductor devices 10 are completed (the fourth step) by dividing the semiconductor chip 1 in a combination of processor bare chip 1a and memory bare chip 1b.

Figure 4A:
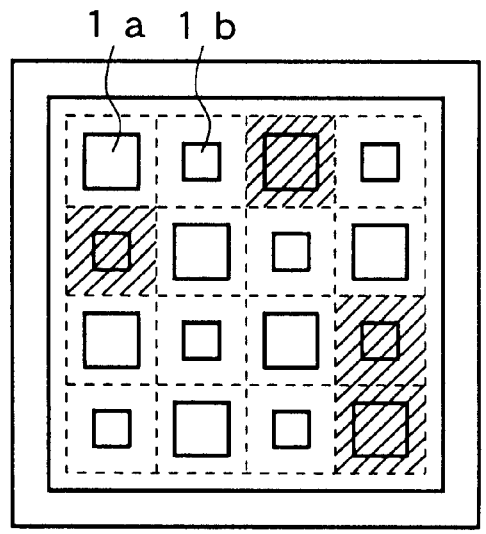
FIGS. 4(a) and 4(b) are figures showing an example of a method for dividing the semiconductor chip implemented on the substrate.
Figure 4B:
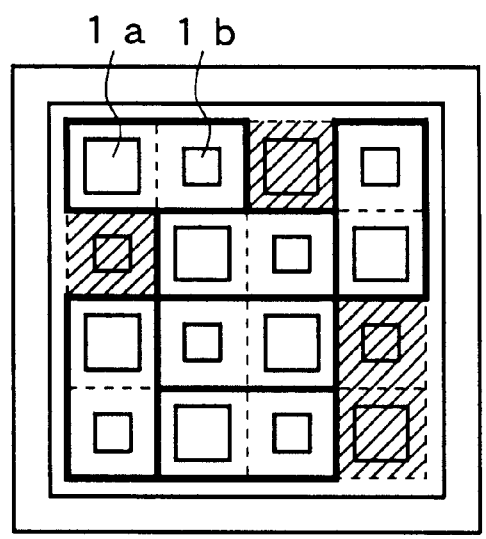

FIG. 4 is a figure showing an example of a method for dividing the memory bare chip implemented on the substrate 2. FIG. 4(a) is a figure showing the result of inspection in the third step described above. In this figure, the shaded portions represent semiconductor chips determined defective and the other portions represent semiconductor chips determined good pieces. FIG. 4(b) is a figure showing a dividing manner for semiconductor chips judged to be nondefective. A region surrounded by a bold line shows the unit of division.

As described above, semiconductor chips 1 are divided in a combination of a processor bare chip 1a and memory bare chip 1b. Therefore, as shown in the FIG. 4(b), six semiconductor devices 10 can be manufactured by dividing semiconductor chips considering the combination of good processor bare chip 1a and good memory bare chip 1b adjacent each other. In contrast to this method, only four semiconductor devices 10 can be manufactured in case of mechanical division by combination of transversely arranged two semiconductor chips 1. However, by applying the method according to the present embodiment, fraction defective can be greatly decreased.

As described above, manufacture of the semiconductor device 10 is carried out by implementing a plurality of semiconductor chips 1 on the substrate 2 and dividing only those, among these semiconductor chips 1, judged to be nondefective by quality inspection. Therefore, a defect part of semiconductor chips 1 does not cause defect product of overall semiconductor device 10 to allow reducing the defect rate in manufacture of the semiconductor device 10. Particularly, the semiconductor 10 is formed in combination of an adjacent plurality of processor bare chip 1a and memory bare chip 1b. In implementation of these semiconductor chips 1 on the substrate 2, when processor bare chip 1a and memory bare chip 1b are arranged to abut each other in four directions for implementation, a processor bare chip 1a can be combined with another memory bare chip 1b even if an adjacent other memory bare chip 1b is defect product. Moreover, a memory bare chip 1b can be combined with another processor bare chip 1a even if an adjacent other processor bare chip 1a is defect product. Therefore, the semiconductor 10 can be efficiently manufactured. Besides, inspection efficiency is improved by simultaneous inspection of a plurality of semiconductor chips 1 implemented on the substrate 2 in a unit of the overall substrate 2.

Figure 5:
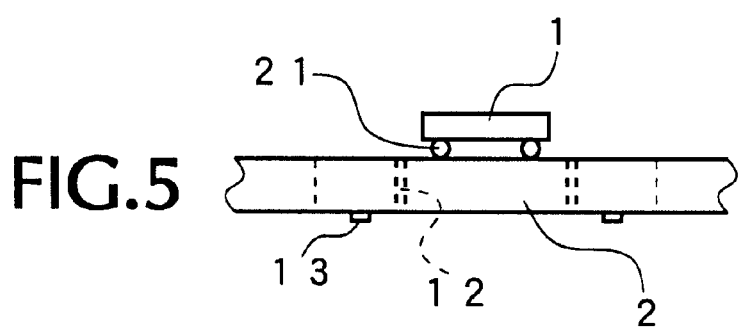
FIG. 5 is a figure showing a condition in which the semiconductor chip is connected to the substrate in case of the flip chip implementation.

The present invention is not restricted to the embodiments described above and can be carried out by various modifications in a range of the scope of the present invention. Wire bonding implementation was carried out in the embodiments as described above, however, for example, the semiconductor chips 1 may be implemented by the flip chip implementation. FIG. 5 is a figure showing a condition in which the semiconductor chip 1 is connected to the substrate 2 in case of the flip chip implementation. As shown in the figure, the flip chip implementation is carried out by arranging the substrate pad formed on an implementation surface of the semiconductor chip 1 and the chip pad formed on the surface of the substrate 2, on which the semiconductor chip 1 is implemented, in an opposite position to connect each other by a bump 21. The flip chip implementation allows high density implementation. Thus, the external size of the semiconductor device 10 to be manufactured can be further miniaturized. In various semiconductor chips including DRAM in the future, the length of wire is preferable as short as possible to allow a high speed operation. The shorter wiring length can be realized by adopting the flip chip implementation.

Figure 6:
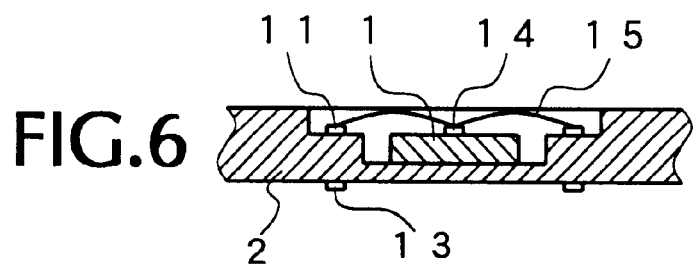
FIG. 6 is a figure showing sectional views of the semiconductor chip and the substrate, which make a CIB structure.

In the embodiment described above, respective semiconductor chips 1 and a bonding wire 15 project out on the substrate 2, because respective semiconductor chips 1 is mounted on the substrate 2 and the COB implementation was carried out thereon. CIB (Chip In Board) structure, in which the bonding wire 15 or the like does not project to outside, is possible by containing respective semiconductor chips 1 in the substrate 2. FIG. 6 is a figure showing sectional views of the semiconductor chip 1 and the substrate 2, which make a CIB structure. As shown in the figure, vertical movement of capillary of a wire bonding device can be decreased in implementation to make improvement of working efficiency possible by forming a recess on the substrate 2, implementing the semiconductor chips 1 inside the recess, and arranging the substrate pad 11 and the chip pad 14 on an almost same surface. In addition, the bonding wire 15 does not contact with the end of the semiconductor chips 1 and wires do not short in this portion to make decrease in defect rate possible.

Figure 7A:
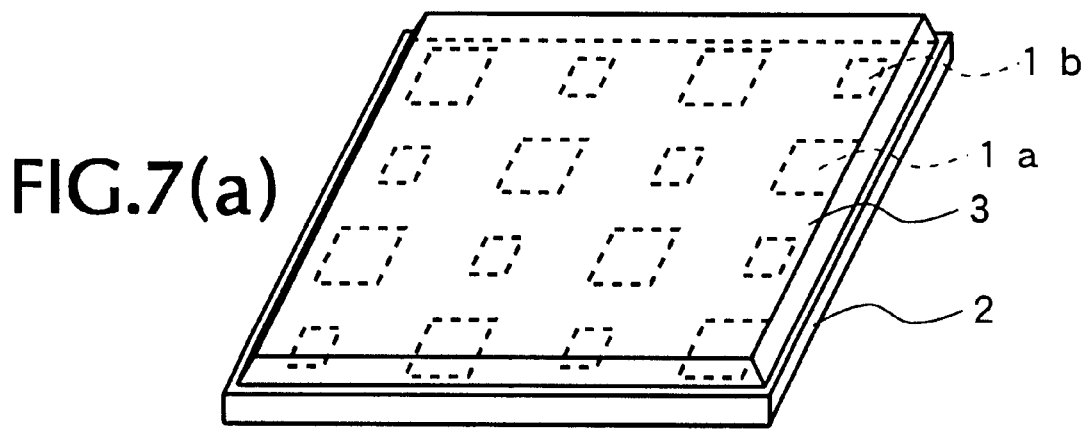
FIGS. 7(a) and 7(b) are figures illustrating an outline of resin molding by a transfer mold.
Figure 7B:
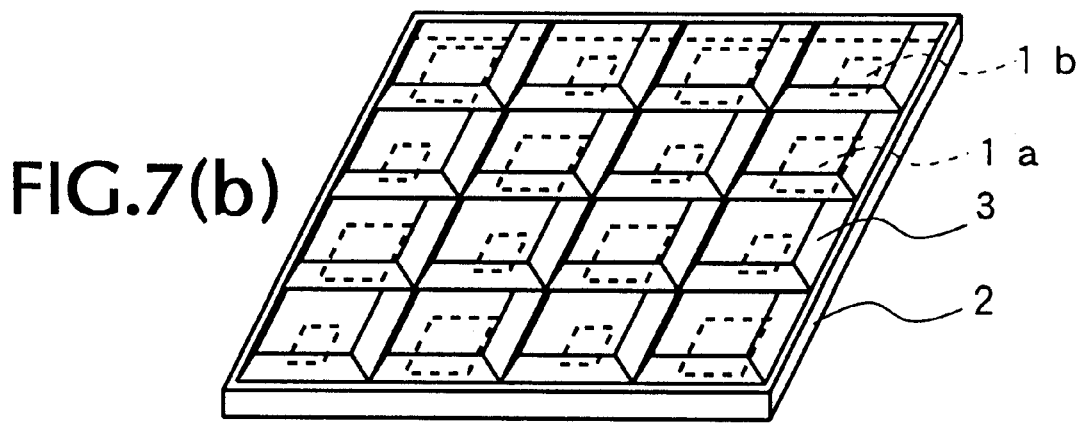

In the embodiment described above, the resin 3 is simply poured to seal the surface of the substrate 2 on which semiconductor chips 1 are implemented. However, resin sealing may be carried out with a transfer mold by injection molding. FIG. 7 is a figure illustrating an outline of resin molding by the transfer mold. FIG. 7(a) shows the case where flat resin is formed on entire substrate 2 and 7(b) is a modification of the FIG. 7A and shows the case where a groove is formed by dividing line. The resin formation with transfer mold allows shortening of a molding time and suitable for mass production.

In the embodiment described above, a BGA pad 13 is used as the external connecting terminal of the semiconductor device 10. However, the terminal of so-called LCC (Leadless Chip Carrier) system may be used.

Figure 8:
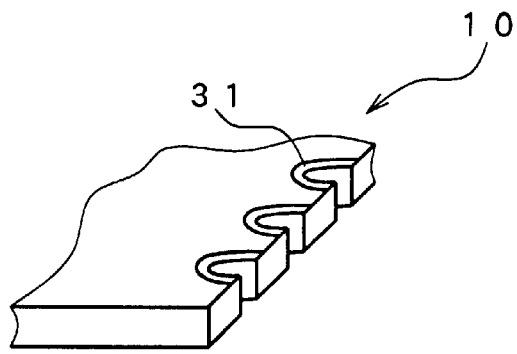
FIG. 8 is a figure showing a partial structure of a semiconductor device in case of using an external connecting terminal of LCC system.

FIG. 8 is a figure showing a partial structure of a semiconductor device 10 in case of using an external connecting terminal of LCC system. As shown in the figure, the recess is formed in any one direction (or both direction) of a longitudinal direction and a transverse direction among side surfaces of the semiconductor device 10 after dividing. The external connecting terminal 31 is formed to cover the surface of the recess by metal plating.

Figure 9A:
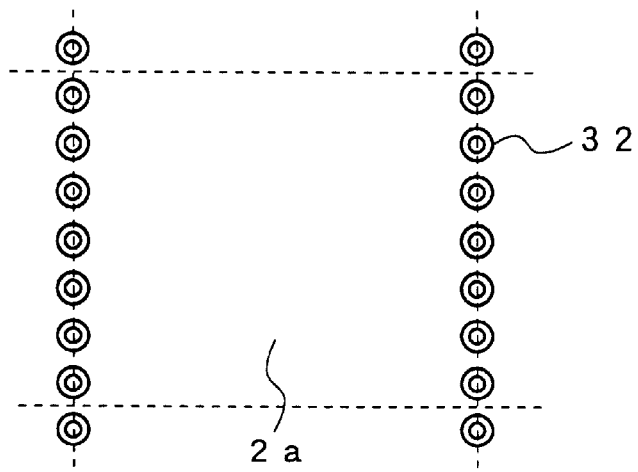
FIGS. 9(a) and 9(b) are figures showing illustrating a procedure of forming the external connecting terminal in case of using the external connecting terminal of LCC system.
Figure 9B:
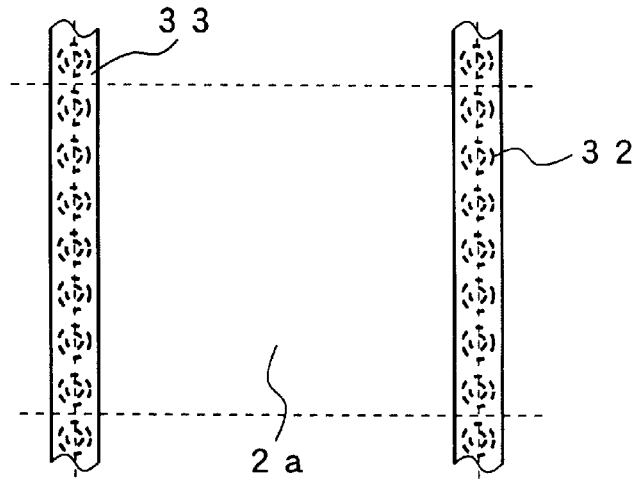

FIG. 9 is a figure showing illustrating a procedure of forming the external connecting terminal 31 in case of using the external connecting terminal of LCC system. As shown in the FIG. 9(a), a through hole 32 is formed on the substrate 2a along with any one (or both) of the longitudinal direction and the transverse direction among dividing lines to divide the semiconductor chip 1 implemented. However, in using the substrate 2a for manufacture of the semiconductor device 10 as it is, clogging of the external connecting terminal 31 may cause by the resin 3 which is poured in resin sealing in the second manufacturing step described above. Therefore, as shown in the FIG. 9B, a protecting member such as an insulating tape 33 is formed along with the through hole 32 to prevent pouring of the resin 3 in the through hole 32. Or, solder may be poured in the through hole 32 to prevent clogging caused by the resin. Subsequently, the through hole 32 described above is cut in its center to form the external connecting terminal 31 as shown in the FIG. 8.

The semiconductor device 10 is formed by combining two different kinds of semiconductor chips 1 in the embodiment described above, the combination of more different kinds of semiconductor chips 1 (for example, four) is possible. In this case, it is not necessary that all chips differ from each other and it is satisfactory that at least two kinds of chips are combined. Besides, the combinations of different kinds of semiconductor chips 1 include the combination of the memory bare chips of different types. Furthermore, the combination of same DRAMs with different bit configurations or different capacities is also possible.

Industrial Applicability

As described above, according to the present invention, dividing semiconductor chips is carried out according to the result of quality inspection. Therefore, a defective part of semiconductor chips contained in the semiconductor device does not cause defect of overall semiconductor device. Thus, the defect rate in manufacturing the semiconductor device can be reduced. In addition, the semiconductor chip inspected for every overall substrate unit allows improving an efficiency of inspection in comparison with inspection for individual one or a few semiconductor chips.

What is claimed is:

1. A semiconductor device, wherein said semiconductor device is formed, after a plurality of different kinds of semiconductor chips that are implemented on a substrate are sealed with a resin, by dividing the semiconductor chips in a unit of a given numbers of plurality according to a result of quality inspection of respective semiconductor chips.

2. A method for manufacturing a semiconductor device, comprising:
    a first step of implementing a plurality of different kinds of semiconductor chips on a substrate,
    a second step of sealing a plurality of identical semiconductor chips implemented with a resin,
    a third step of quality inspecting said respective semiconductor chips, and
    a fourth step of dividing one or a plurality of said semiconductor chips on the basis of the result of said inspecting.

3. The method for manufacturing a semiconductor device according to claim 2, wherein:
    a plurality of said semiconductor chips implemented in said first step is formed on a one surface of said substrate; and
    said quality inspecting in said third step is carried out through a terminal corresponding to a plurality of said semiconductor chips formed on another surface of said substrate.

* * * * *